(12) United States Patent
Toyama et al.

(10) Patent No.: US 11,330,704 B2
(45) Date of Patent: May 10, 2022

(54) ELECTRONIC CONTROL DEVICE

(71) Applicant: HITACHI AUTOMOTIVE SYSTEMS, LTD., Hitachinaka (JP)

(72) Inventors: Masahiro Toyama, Tokyo (JP); Umberto Paoletti, Tokyo (JP); Takeshi Yamakawa, Hitachinaka (JP); Yoko Ohkubo, Hitachinaka (JP); Hideyuki Sakamoto, Hitachinaka (JP)

(73) Assignee: HITACHI ASTEMO, LTD., Ibaraki (JP)

( * ) Notice: Subject to any disclaimer, the term of this patent is extended or adjusted under 35 U.S.C. 154(b) by 206 days.

(21) Appl. No.: 16/769,891

(22) PCT Filed: Nov. 13, 2018

(86) PCT No.: PCT/JP2018/041997
§ 371 (c)(1),
(2) Date: Jun. 4, 2020

(87) PCT Pub. No.: WO2019/111655
PCT Pub. Date: Jun. 13, 2019

(65) Prior Publication Data
US 2021/0185795 A1 Jun. 17, 2021

(30) Foreign Application Priority Data
Dec. 8, 2017 (JP) .............................. JP2017-236298

(51) Int. Cl.
*H05K 1/02* (2006.01)
*H01L 23/367* (2006.01)
(Continued)

(52) U.S. Cl.
CPC ......... *H05K 1/025* (2013.01); *H01L 23/3675* (2013.01); *H01L 23/66* (2013.01);
(Continued)

(58) Field of Classification Search
CPC .. H05K 1/025; H05K 5/0047; H05K 7/20409; H05K 7/20436
(Continued)

(56) References Cited

U.S. PATENT DOCUMENTS 9,214,406 B2 * 12/2015 Yoshimi ................ H01L 23/053
2011/0013370 A1    1/2011 Oota
(Continued)

FOREIGN PATENT DOCUMENTS

JP   2008-193108 A   8/2008
JP   2011-023459 A   2/2011
(Continued)

OTHER PUBLICATIONS

International Search Report, PCT/JP2018/041997, dated Jan. 29, 2019, 1pg.
Japanese Office Action dated Jul. 13, 2021 for Japanese Patent Application No. 2017-236298.

*Primary Examiner* — Sherman Ng
(74) *Attorney, Agent, or Firm* — Volpe Koenig

(57) ABSTRACT

An electronic control device includes a housing that stores a substrate on which an electronic component is mounted, a first capacitance unit formed between the housing and the electronic component, and a second capacitance unit formed between the housing and the substrate, in which a noise transmission path is formed between the housing and the substrate via the first capacitance unit and the second capacitance unit.

12 Claims, 16 Drawing Sheets

(51) Int. Cl.
  *H01L 23/66* (2006.01)
  *H05K 1/18* (2006.01)
  *H05K 5/00* (2006.01)
  *H05K 7/20* (2006.01)
  *H05K 9/00* (2006.01)

(52) U.S. Cl.
  CPC ........... *H05K 1/181* (2013.01); *H05K 5/0047* (2013.01); *H05K 7/20436* (2013.01); *H01L 2223/6661* (2013.01); *H05K 5/0069* (2013.01); *H05K 7/20409* (2013.01); *H05K 9/0022* (2013.01); *H05K 2201/10371* (2013.01)

(58) Field of Classification Search
  USPC ......................................................... 361/714
  See application file for complete search history.

(56) References Cited

U.S. PATENT DOCUMENTS

2011/0096505 A1   4/2011   Inoue
2015/0187732 A1*  7/2015   Yoshimi .............. H01L 25/0655
                                                257/713
2018/0226319 A1*  8/2018   Yamamoto .......... H01L 23/3675

FOREIGN PATENT DOCUMENTS

| JP | 2011-054640 A | 3/2011 |
| JP | 2012-146822 A | 8/2012 |
| JP | 2015-126095 A | 7/2015 |
| JP | 2016-119394 A | 6/2016 |
| JP | 2018-133531 A | 8/2018 |

* cited by examiner

[FIG. 1]
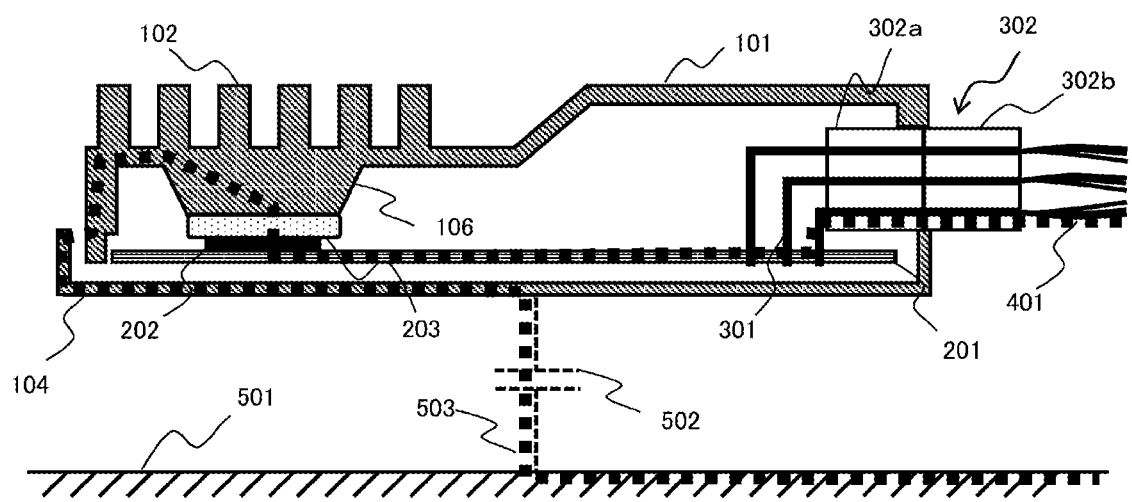

[FIG. 2]
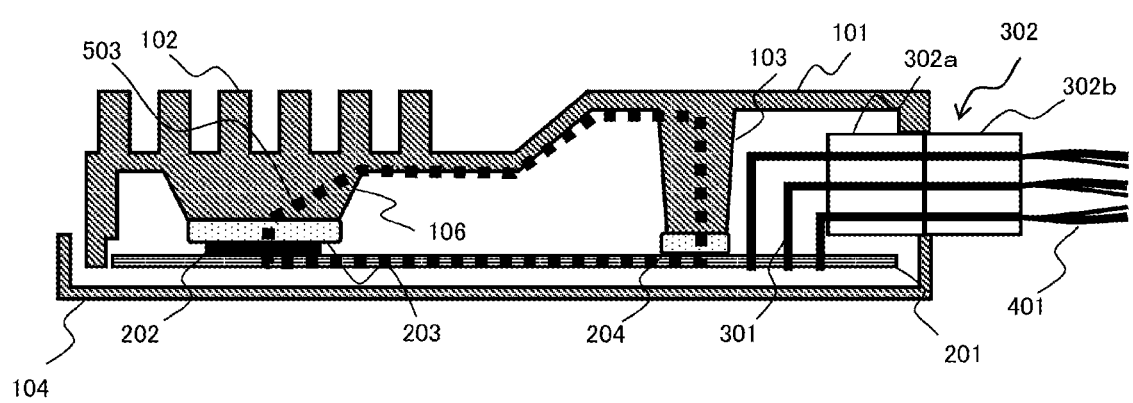

[FIG. 3]
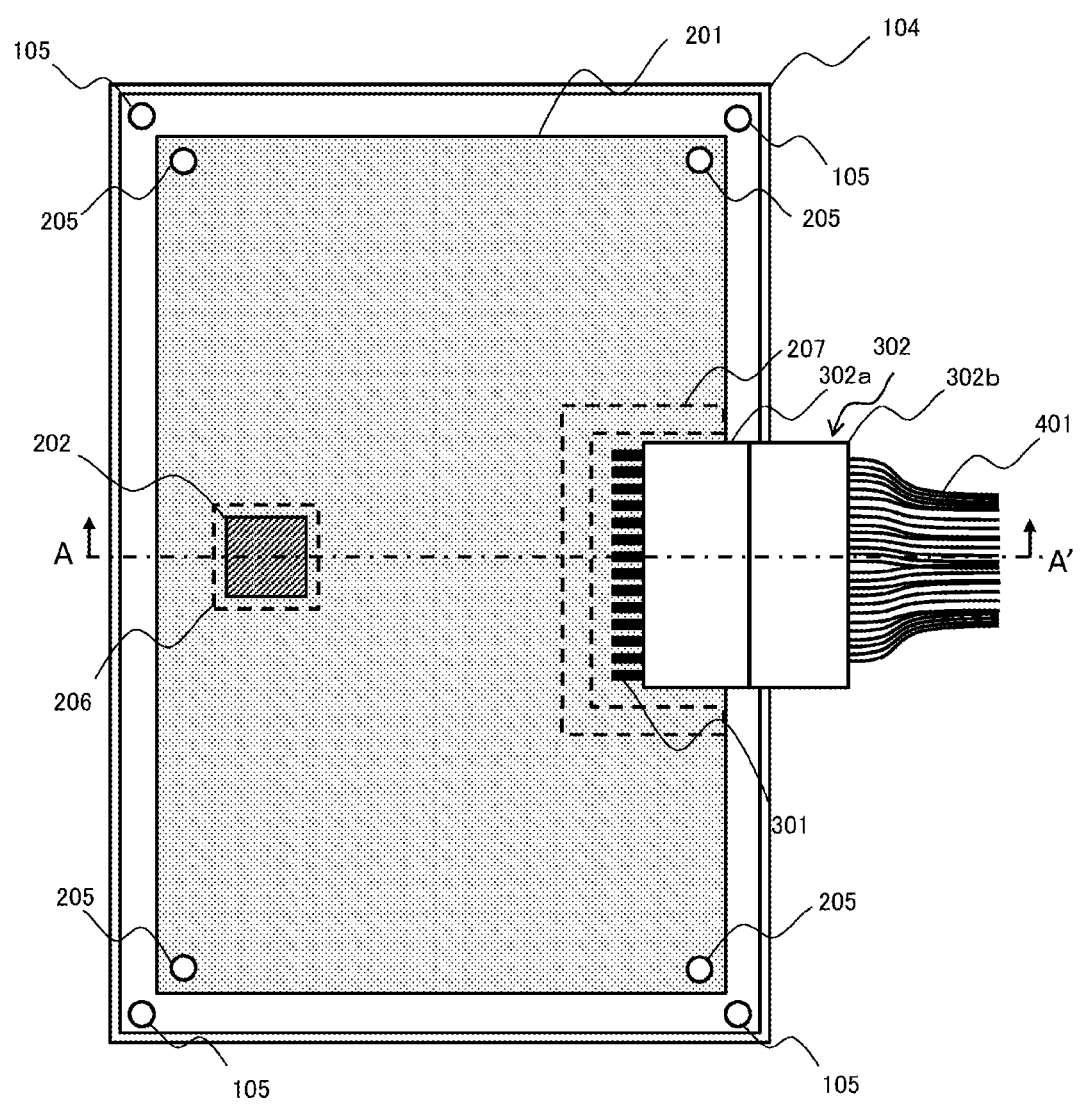

[FIG. 4]
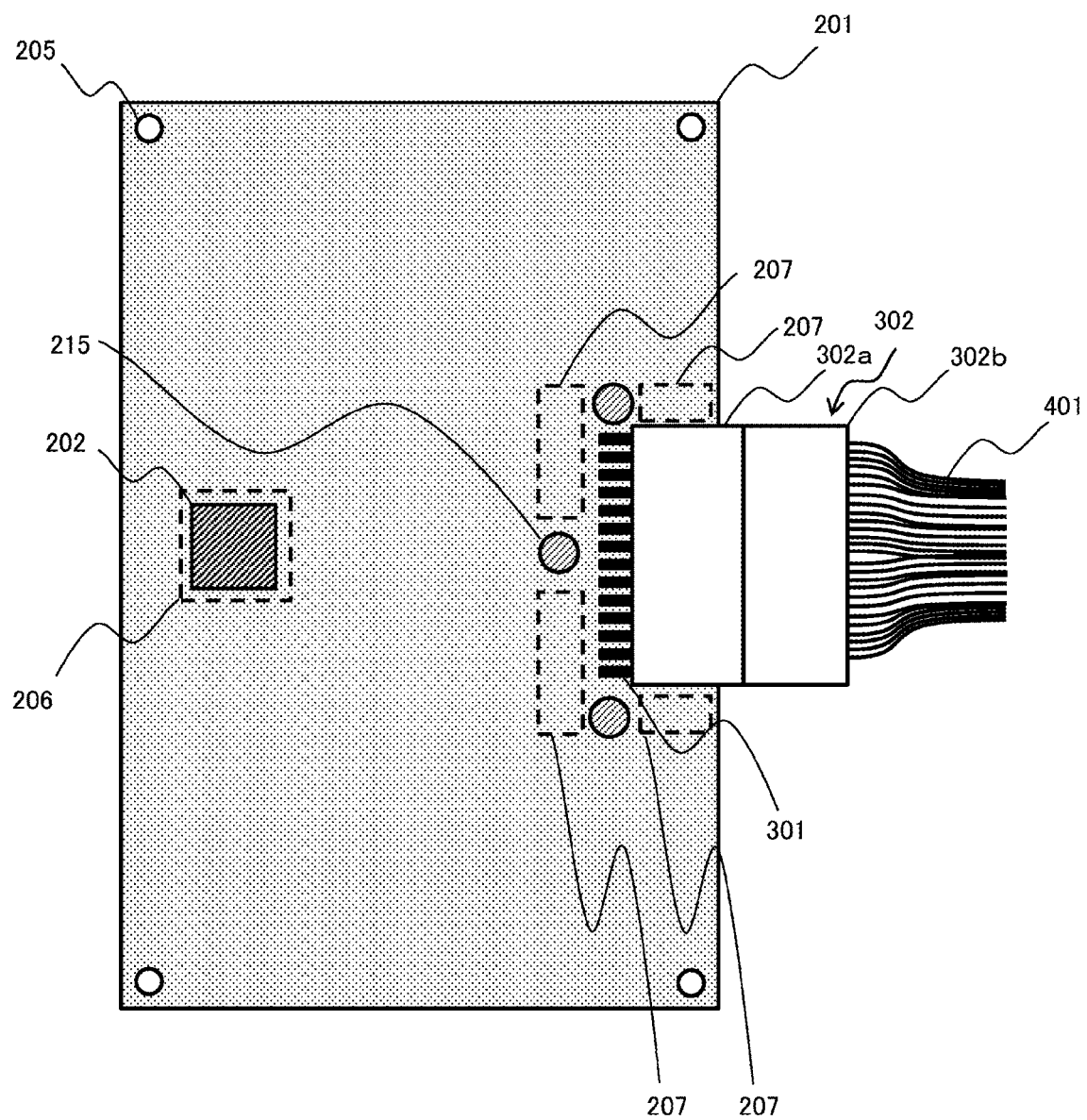

[FIG. 5]
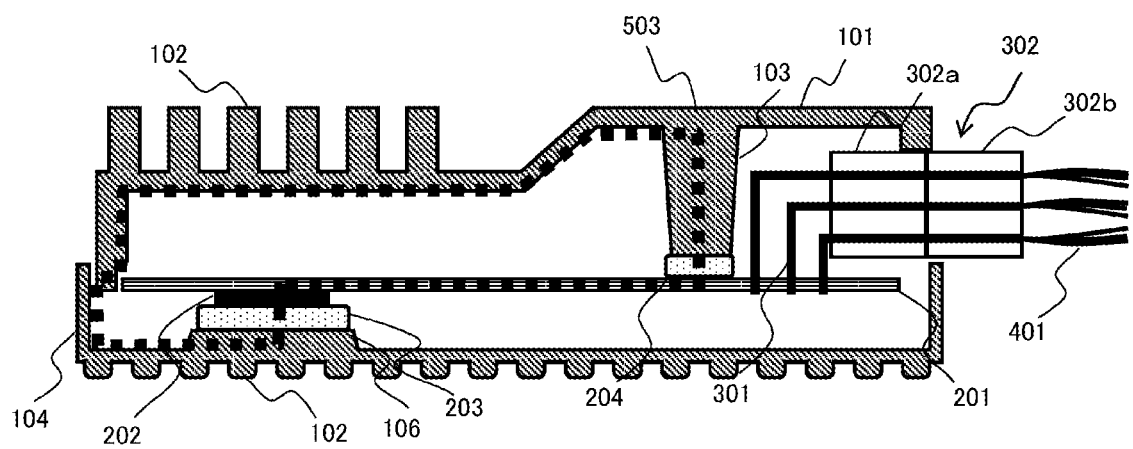

[FIG. 6]
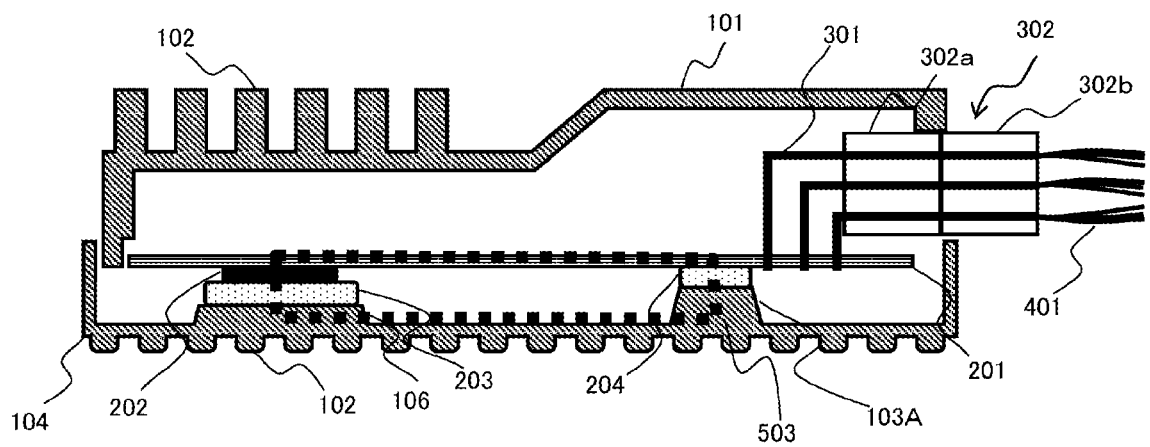

[FIG. 7]
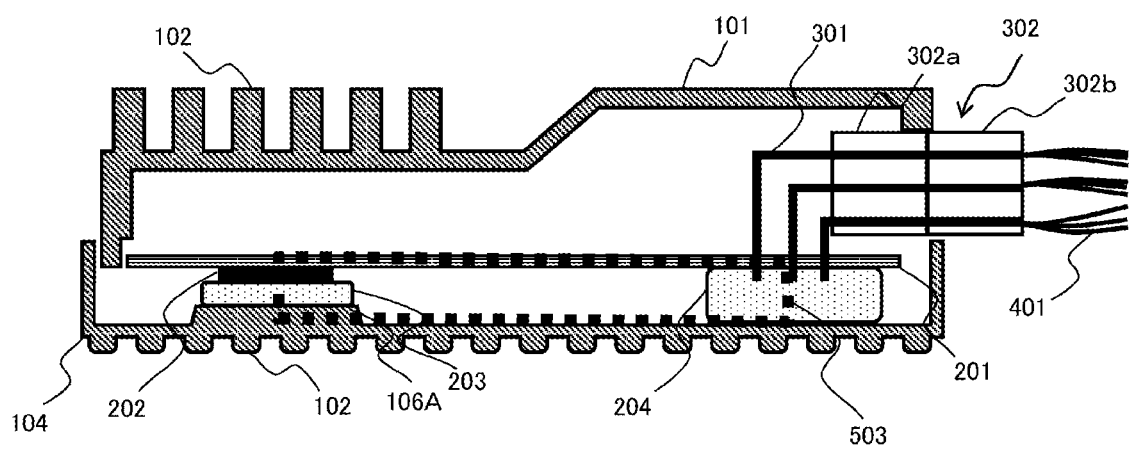

[FIG. 8]
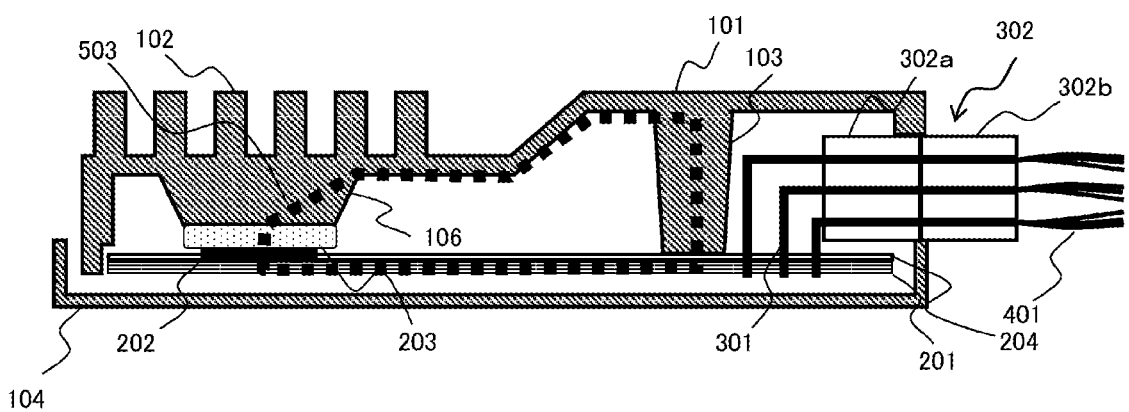

[FIG. 9]
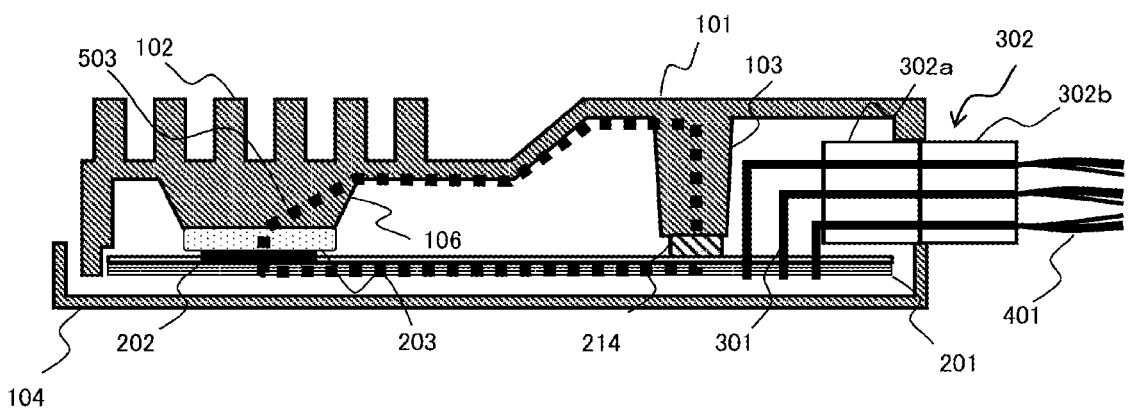

[FIG. 10]
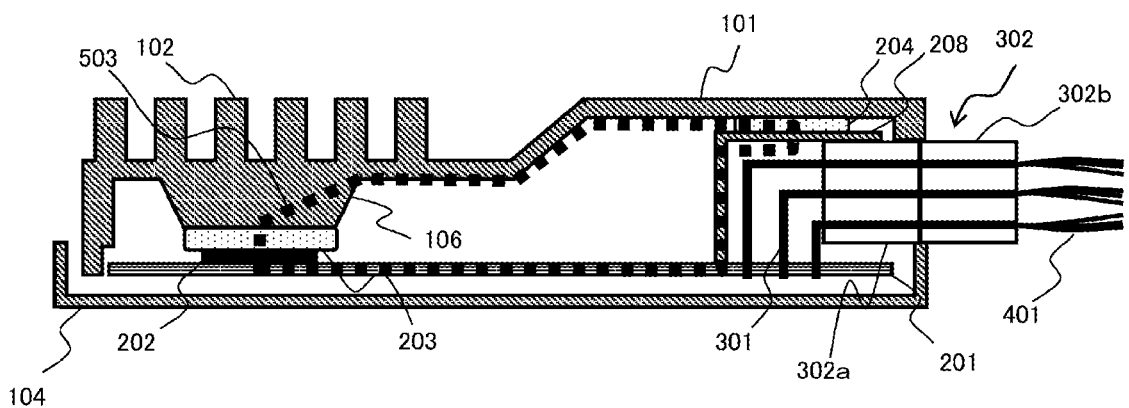

[FIG. 11]
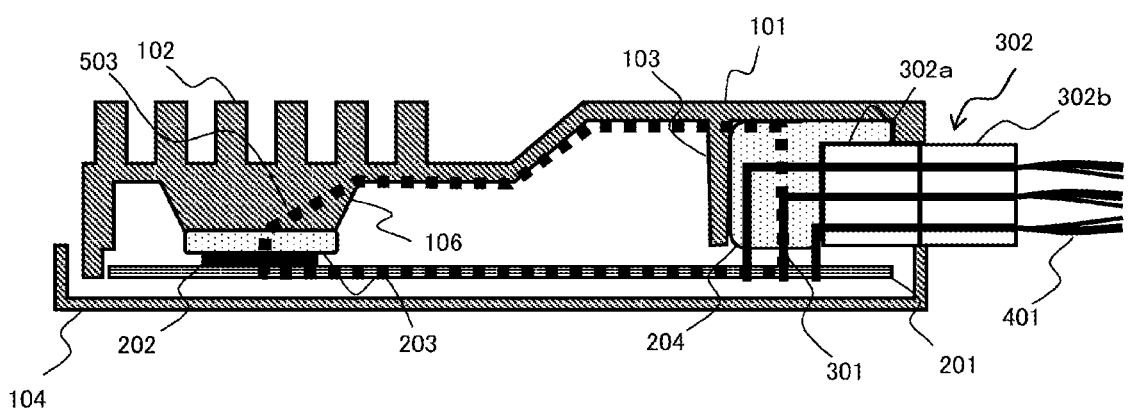

[FIG. 12]
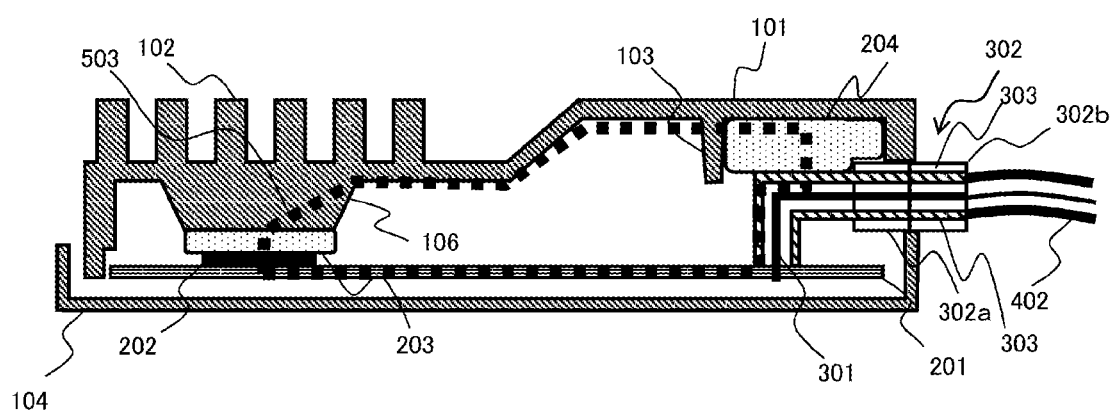

[FIG. 13]
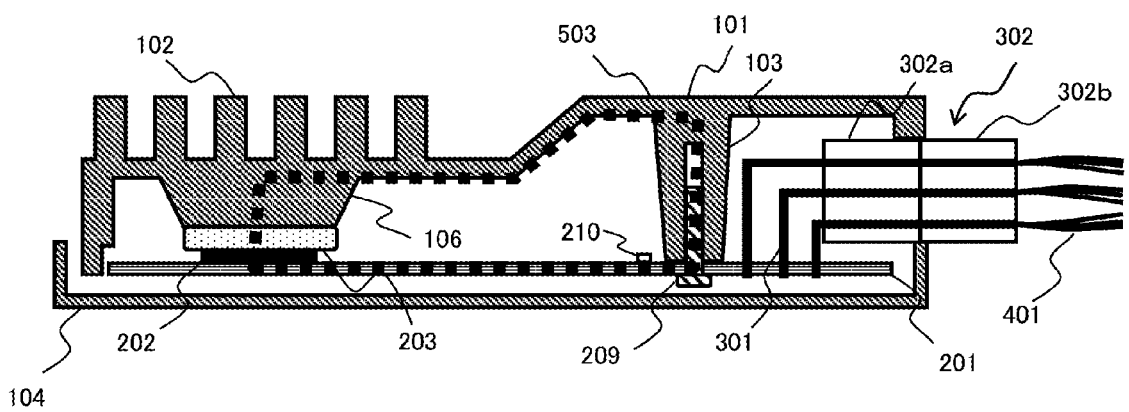

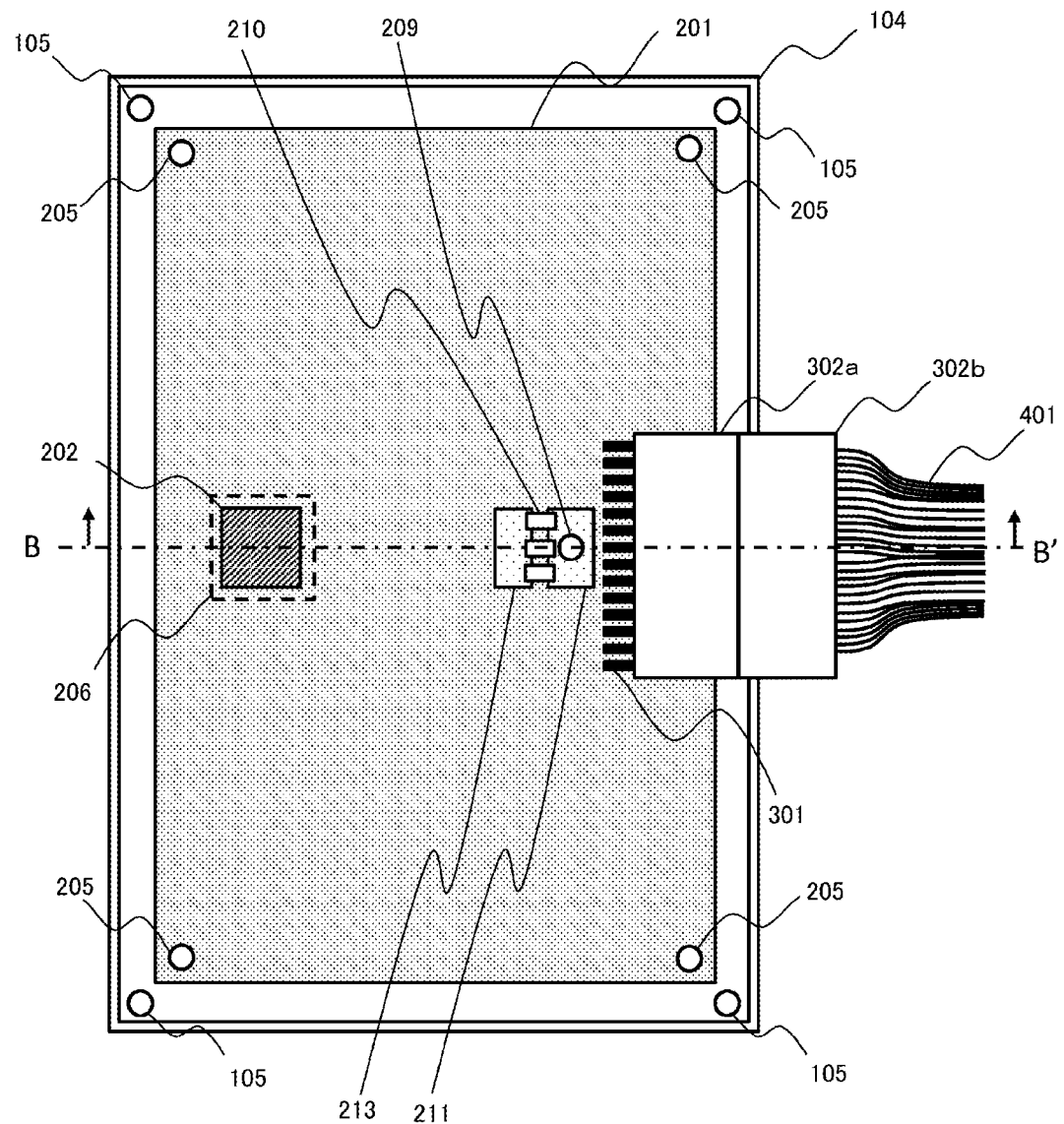
[FIG. 14]

[FIG. 15]
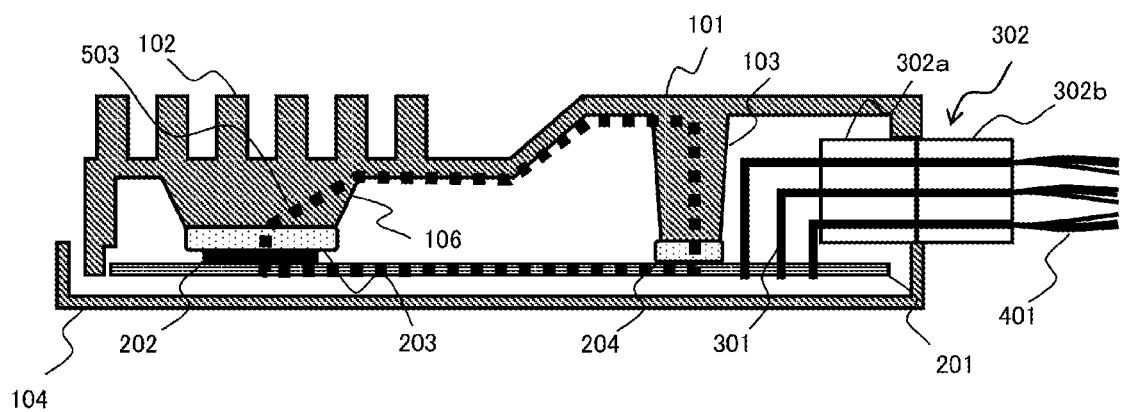

[FIG. 16]
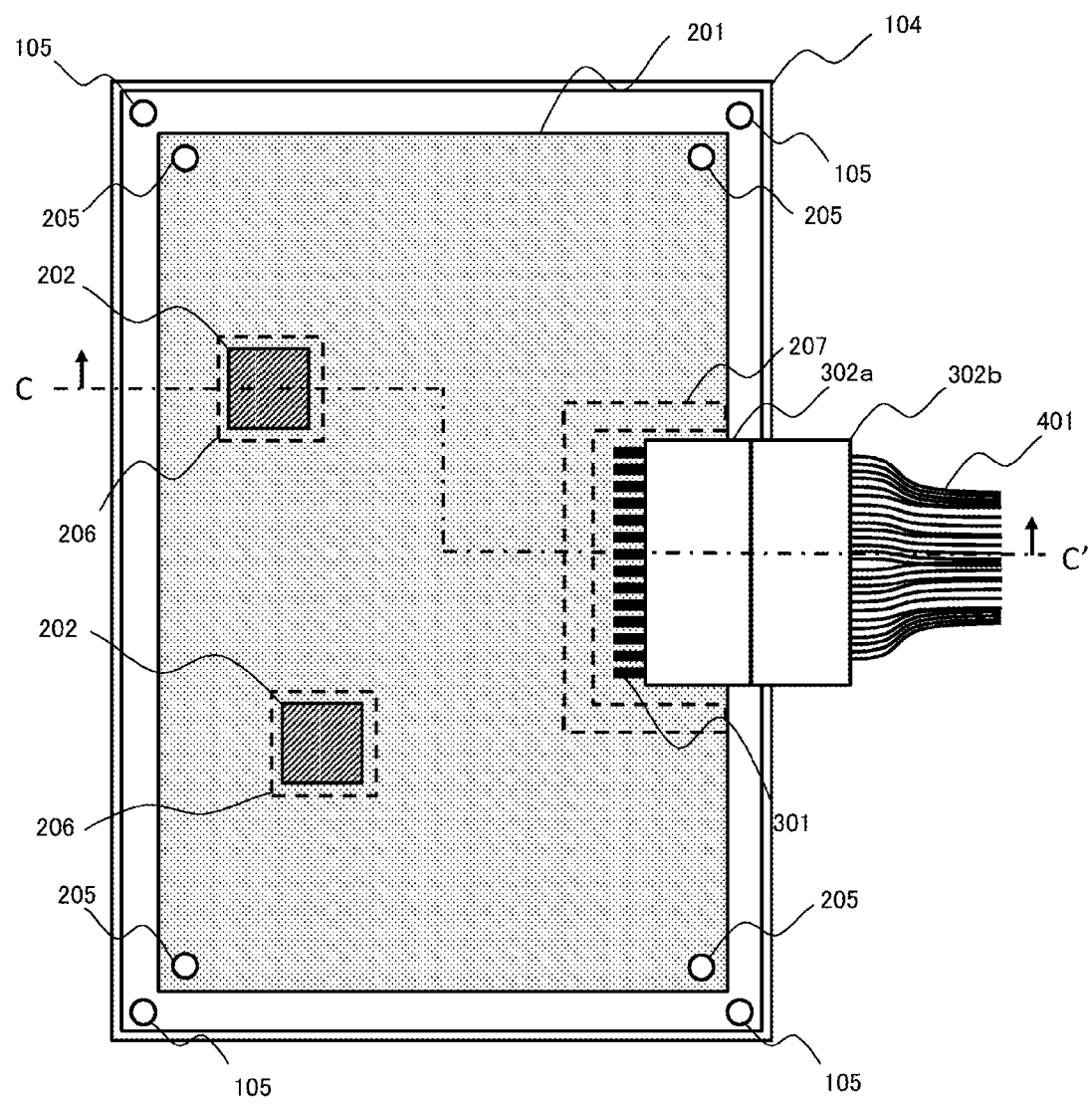

ELECTRONIC CONTROL DEVICE

TECHNICAL FIELD

The present invention relates to an electronic control device.

BACKGROUND ART

A driving support system represented with a collision damage reduction brake of a vehicle, an automated driving, and the like is being studied for widespread use. Such an electronic control device mounted on a vehicle is required to have a high calculation performance. In order to meet the requirement, it is necessary for a semiconductor chip such as a CPU having a high operating frequency to be mounted on the electronic control device.

On the other hand, unnecessary electromagnetic radiation (noise) is generated from the electronic control device on which the semiconductor chip having a high operating frequency is mounted. Also, the semiconductor chip operating at high speed also generates heat in a large amount. PTL 1 discloses that an electromagnetic wave shielding plate is provided to cover a circuit substrate on which an electronic component is disposed, and the electromagnetic wave shielding plate is utilized as a heat dissipating plate by interposing a thermally conductive member between the electronic component and the electromagnetic wave shielding plate.

CITATION LIST

Patent Literature

PTL 1: Japanese Laid-Open Patent Publication No. 2011-054640

SUMMARY OF INVENTION

Technical Problem

In PTL 1, in a case where the thermally conductive member is set to be thin in order to improve a heat dissipation effect, an impedance of a parasitic capacitance formed between the electronic component and the electromagnetic wave shielding plate decreases in inverse proportion to the operating frequency and the capacitance value. Accordingly, noise due to operation of the electronic component leaks out of the electromagnetic wave shielding plate via the formed parasitic capacitance when the operating frequency of the electronic component increases.

Solution to Problem

According to a first aspect of the invention, an electronic control device preferably includes a housing that stores a substrate on which an electronic component is mounted, a first capacitance unit formed between the housing and the electronic component, and a second capacitance unit formed between the housing and the substrate, in which a noise transmission path is formed between the housing and the substrate via the first capacitance unit and the second capacitance unit.

Advantageous Effect

According to the invention, noise caused by operation of the electronic component can be prevented from leaking to an outside of the electronic control device.

BRIEF DESCRIPTION OF DRAWINGS

FIG. 1 is a cross-sectional view of an electronic control device according to a comparative example.

FIG. 2 is a cross-sectional view of an electronic control device according to a first embodiment.

FIG. 3 is a top view of the electronic control device according to the first embodiment.

FIG. 4 is a top view of an electronic control device according to a second embodiment.

FIG. 5 is a cross-sectional view of an electronic control device according to a third embodiment.

FIG. 6 is a cross-sectional view of an electronic control device according to a fourth embodiment.

FIG. 7 is a cross-sectional view of an electronic control device according to a fifth embodiment.

FIG. 8 is a cross-sectional view of an electronic control device according to a sixth embodiment.

FIG. 9 is a cross-sectional view of the electronic control device according to the sixth embodiment.

FIG. 10 is a cross-sectional view of an electronic control device according to a seventh embodiment.

FIG. 11 is a cross-sectional view of an electronic control device according to an eighth embodiment.

FIG. 12 is a cross-sectional view of an electronic control device according to a ninth embodiment.

FIG. 13 is a cross-sectional view of an electronic control device according to a tenth embodiment.

FIG. 14 is a top view of the electronic control device according to the tenth embodiment.

FIG. 15 is a cross-sectional view of an electronic control device according to an eleventh embodiment.

FIG. 16 is a top view of the electronic control device according to the eleventh embodiment.

DESCRIPTION OF EMBODIMENTS

Comparative Example

FIG. 1 shows the comparative example. The comparative example shows an example of an electronic control device to be compared with an embodiment.

FIG. 1 is a cross-sectional view of the electronic control device according to the comparative example. A semiconductor chip 202, which is an electronic component, is mounted on a print substrate 201. Also, a connector 302 that connects a wire harness 401 for drawing in a power source and a communication wire is mounted on the print substrate 201. A connector pin 301 is connected to the print substrate 201. The connector 302 includes a female connector 302a and a male connector 302b. The female connector 302a is mounted on the print substrate 201.

The print substrate 201 is sandwiched between a housing upper portion 101 and a housing lower portion 104. A first convex portion 106 is formed on the housing upper portion 101 on a print substrate 201 side facing the semiconductor chip 202. A thermal grease 203 is inserted between the semiconductor chip 202 and the first convex portion 106. Heat generated in the semiconductor chip 202 is transferred from the thermal grease 203 to the housing upper portion 101, and is conducted or radiated into air from the heat dissipation fins 102 provided in the housing upper portion 101.

On the other hand, noise current caused by the semiconductor chip 202 operating at a high operating frequency is transmitted to the housing upper portion 101 via a parasitic capacitance of the thermal grease 203. The housing upper portion 101 and the lower housing portion 104 are formed of metal and are fixed to each other by screws. A noise current path 503 through which the noise current transmits is indicated by a dotted line in the figure.

Apart of the noise current transmitted from the housing upper portion 101 to the housing lower portion 104 is transmitted to a ground 501 (vehicle body) via a parasitic capacitance 502 between the housing lower portion 104 and the ground 501. The noise current transmitted to the ground 501 returns to the print substrate 201 via the wire harness 401 through an external device (not shown). By doing so, a large noise current loop having high radiation efficiency is formed outside the electronic control device and unnecessary electromagnetic radiation (noise) is generated.

In a case where the electronic control device is mounted on an automobile, although the housing upper portion 101, the housing lower portion 104, and the ground 501 may be electrically connected to each other, a noise current loop is formed outside the electronic control device in the same manner and unnecessary electromagnetic radiation is generated since the noise current flows from the housing upper portion 101 and the housing lower portion 104 to the ground 501 without passing through the parasitic capacitance 502 between the housing upper portion 101, the housing lower portion 104 and the ground 501.

In each embodiment described below, noise caused by operation of an electronic component is prevented from leaking to the outside of an electronic control device.

First Embodiment

FIGS. 2 and 3 show the first embodiment of the invention. FIG. 2 is a cross-sectional view taken along a line A-A' of an electronic control device shown in FIG. 3. FIG. 3 is a top view of the electronic control device with the housing upper portion 101 removed. The same reference numerals are given to the same parts as those in the comparative example in FIG. 1.

As shown in FIG. 2, the semiconductor chip 202 such as a CPU, which is an electronic component, is mounted on the print substrate 201. Also, the connector 302 that connects the wire harness 401 for drawing in a power source and a communication wire is mounted on the print substrate 201. The connector pin 301 is connected to the print substrate 201. The connector pin 301 is a terminal that establishes an electrical connection between the print substrate 201 and an external device (not shown). The connector 302 includes the female connector 302a and the male connector 302b. The female connector 302a is mounted on the print substrate 201.

The print substrate 201 is sandwiched between the housing upper portion 101 and the housing lower portion 104. The first convex portion 106 is formed on the housing upper portion 101 on a print substrate 201 side facing the semiconductor chip 202. The thermal grease 203 is inserted between the semiconductor chip 202 and the first convex portion 106. The thermal grease 203 is, for example, a material having a high thermal conductivity in which a ceramic material is mixed with a silicone-based resin. Heat generated in the semiconductor chip 202 is transferred from the thermal grease 203 to the housing upper portion 101, and is conducted or radiated into the air from the heat dissipation fins 102 provided in the housing upper portion 101.

As shown in FIG. 2, a second convex portion 103 is provided on the housing upper portion 101 facing the print substrate 201 at a position on inner side of the housing upper portion 101 and in the vicinity of the connector pin 301. A dielectric 204 is inserted between the second convex portion 103 and the print substrate 201. The dielectric 204 is, for example, an insulating material in which a ceramic material is mixed with a silicone-based resin. The print substrate 201 includes a GND pattern and thus the dielectric 204 achieves capacitive coupling between the housing upper portion 101 and the print substrate 201.

Accordingly, a noise current caused by the semiconductor chip 202 forms a noise current path 503 passing through the second convex portion 103, the dielectric 204, and the print substrate 201 from the housing upper portion 101. Here, since the noise current path 503 is formed through an inner wall side of the housing upper portion 101, electromagnetic radiation generated by a noise current loop being exposed to the outside of a housing can be prevented. The noise current path 503 does not pass through the outside of the housing as shown in the comparative example in FIG. 1 since the noise current path 503 has a lower impedance than the noise current path 503 passing through the outside of the housing shown in the comparative example in FIG. 1.

Accordingly, the electronic control device can prevent noise from leaking to the outside of the electronic control device while ensuring heat dissipation performance.

FIG. 3 is a top view of the electronic control device when the housing upper portion 101 is removed. FIG. 2 is a cross-sectional view at a position of A-A' in FIG. 3. As shown in FIG. 3, the print substrate 201 has screw holes 205 at four corners thereof and is fixed to the housing upper portion 101 (not shown) by screws. The housing lower portion 104 has screw holes 105 at four corners thereof and is fixed to the housing upper portion 101 by screws.

As shown in FIG. 3, the thermal grease 203 on the semiconductor chip 202 is coated to an area 206 on the print substrate 201 in a manner of including the semiconductor chip 202. The dielectric 204 is coated to an area 207 on the print substrate 201 facing the second convex portion 103. The second convex portion 103 is formed in a U-shape to surround the connector 302 facing the print substrate 201 at a position on the inner side of the housing upper portion 101 and in the vicinity of the connector pin 301. The connector 302 includes the female connector 302a and the male connector 302b. The female connector 302a is mounted on the print substrate 201.

Parasitic capacitance (capacitance of a second capacitance unit) due to the dielectric 204 is preferably equal to or higher than parasitic capacitance (capacitance of a first capacitance unit) due to the thermal grease 203. Dielectric constants, thickness and areas of the thermal grease 203 and the dielectric 204 are determined to satisfy such a capacitance condition. For example, when the dielectric 204 uses the same material as the thermal grease 203 and the thickness thereof is the same as that of the thermal grease 203, (area of the area 206)≤(area of the area 207). Although the capacitance of the second capacitance unit is preferably equal to or higher than the capacitance of the first capacitance unit, the same capacitance condition applies to each embodiment described below.

Although it is desirable that no component is mounted in the area 207 where the dielectric 204 is coated from a viewpoint of reducing the thickness of the dielectric 204, a low profile component such as a chip capacitor or a chip resistor may be mounted.

An effect of preventing leakage of electromagnetic waves radiated directly from the electronic component on the print substrate 201 to a space in the housing can be obtained even if the housing of the connector 302 is formed of resin, since the second convex portion 103 is provided on the inner side of the housing upper portion 101 in a manner of surrounding the connector 302.

Second Embodiment

FIG. 4 shows the second embodiment of the invention. FIG. 4 is a top view of the print substrate 201 when an electronic control device is in a state where the housing upper portion 101 is removed as in the first embodiment shown in FIG. 3. Since the cross-sectional view is the same as that of the first embodiment shown in FIG. 2, a cross-sectional view is omitted. The same reference numerals are given to the same parts as those in the first embodiment shown in FIG. 3. As shown in FIG. 4, the present embodiment shows an example in which a tall component 215 such as an electrolytic capacitor is disposed on the print substrate 201 and around the connector 302.

The thermal grease 203 on the semiconductor chip 202 is coated to the area 206 on the print substrate 201 in a manner of including the semiconductor chip 202. The dielectric 204 is coated to the area 207 on the print substrate 201 facing the second convex portion 103. The second convex portion 103 is formed in a U-shape in a manner of surrounding the connector 302 facing the print substrate 201 at a position on an inner side of the housing upper portion 101 and in the vicinity of the connector pin 301. The dielectric 204 is, for example, an insulating material in which a ceramic material is mixed with a silicone-based resin. In this case, the area 207 to which the dielectric 204 is coated is divided into four areas in a manner of avoiding three components 215 in the area 207 on the print substrate 201. Although the area 207 is divided into four areas in this example, a number of divisions of the area 207 is determined according to a number of components 215. A distal end portion of the second convex portion 103 in contact with the dielectric 204 is divided according to the number of divisions of the area 207 so as not to interfere with the tall components 215.

Accordingly, even in a case where the tall components 215 are disposed on the print substrate 201, the electronic control device can prevent noise from leaking to the outside of the electronic control device while ensuring heat dissipation performance.

Third Embodiment

The third embodiment of the invention will be described with reference to FIG. 5. FIG. 5 is a cross-sectional view of an electronic control device. The same reference numerals are given to the same parts as those in the first embodiment shown in FIG. 2.

In the present embodiment, the semiconductor chip 202, which is an electronic component, is mounted on a surface on the other side of amounting surface of the connector 302 on the print substrate 201. The thermal grease 203 is inserted between the semiconductor chip 202 and the first convex portion 106 of the housing lower portion 104. As in the first embodiment, the second convex portion 103 is provided on the housing upper portion 101 facing the print substrate 201 at a position on an inner side of the housing upper portion 101 and in the vicinity of the connector pin 301. The second convex portion 103 is formed in a U-shape in a manner of surrounding the connector 301. The dielectric 204 is inserted between the second convex portion 103 and the print substrate 201. The dielectric 204 is, for example, an insulating material in which a ceramic material is mixed with a silicone-based resin.

The housing upper portion 101 and the lower housing portion 104 are formed of metal and are fixed to each other by screws. The heat dissipation fins 102 are formed on outer surfaces of each of the housing upper portion 101 and the housing lower portion 104.

The print substrate 201 includes a GND pattern and thus the dielectric 204 achieves capacitive coupling between the housing upper portion 101 and the print substrate 201. Accordingly, a noise current caused by the semiconductor chip 202 forms the noise current path 503 passing through the housing upper portion 101, the second convex portion 103, the dielectric 204, and the print substrate 201 from the housing lower portion 104. Here, since the noise current path 503 is formed through inner wall sides of the housing lower portion 104 and the housing upper portion 101, electromagnetic radiation generated by a noise current loop being exposed to the outside of a housing can be prevented. The noise current path 503 does not pass through the outside of a housing since the noise current path 503 has a lower impedance than the noise current path 503 passing through the outside of the housing shown in the comparative example in FIG. 1.

Heat generated in the semiconductor chip 202 is transferred from the thermal grease 203 to the housing lower portion 104 and the housing upper portion 101, and is conducted or radiated into the air from the heat dissipation fins 102 provided in the housing lower portion 104 and the housing upper portion 101.

Accordingly, even in a case where the electronic component is mounted on the surface on the other side of the mounting surface of the connector 302 on the print substrate 201, the electronic control device can prevent noise from leaking to the outside of the electronic control device while ensuring heat dissipation performance.

Fourth Embodiment

The fourth embodiment of the invention will be described with reference to FIG. 6. FIG. 6 is a cross-sectional view of an electronic control device. The same reference numerals are given to the same parts as those in the third embodiment shown in FIG. 5.

In the present embodiment, as shown in FIG. 6, the semiconductor chip 202, which is an electronic component, is mounted on a surface on the other side of a mounting surface of the connector 302 on the print substrate 201 as in the third embodiment. The thermal grease 203 is inserted between the semiconductor chip 202 and the first convex portion 106 of the housing lower portion 104. A second convex portion 103A is provided on the housing lower portion 104 facing the print substrate 201 at a position on an inner side of the housing lower portion 104 and in the vicinity of the connector pin 301. The second convex portion 103A is formed in a U-shape seen from above in a manner of surrounding the connector 301. The dielectric 204 is inserted between the second convex portion 103A and the print substrate 201. The dielectric 204 is, for example, an insulating material in which a ceramic material is mixed with a silicone-based resin.

The housing upper portion 101 and the lower housing portion 104 are formed of metal and are fixed to each other by screws. The heat dissipation fins 102 are formed on outer surfaces of each of the housing upper portion 101 and the housing lower portion 104.

The print substrate 201 includes a GND pattern and accordingly the dielectric 204 achieves capacitive coupling between the housing lower portion 104 and the print substrate 201. Accordingly, a noise current caused by the semiconductor chip 202 forms the noise current path 503 passing through the second convex portion 103A, the dielectric 204, and the print substrate 201 from the housing lower portion 104. Here, since the noise current path 503 is formed through an inner wall side of the housing lower portion 104, electromagnetic radiation generated by a noise current loop being exposed to the outside of a housing can be prevented. The noise current path 503 does not pass through the outside of the housing since the noise current path 503 has a lower impedance than the noise current path 503 passing through the outside of the housing shown in the comparative example in FIG. 1.

Heat generated in the semiconductor chip 202 is transferred from the thermal grease 203 to the housing lower portion 104 and the housing upper portion 101, and is conducted or radiated into the air from the heat dissipation fins 102 provided in the housing lower portion 104 and the housing upper portion 101.

Accordingly, even in a case where the electronic component is mounted on the surface on the other side of the mounting surface of the connector 302 on the print substrate 201, the electronic control device can prevent noise from leaking to the outside of the electronic control device while ensuring heat dissipation performance.

Fifth Embodiment

The fifth embodiment of the invention will be described with reference to FIG. 7. FIG. 7 is a cross-sectional view of an electronic control device. The same reference numerals are given to the same parts as those in the fourth embodiment shown in FIG. 6.

In the present embodiment, as shown in FIG. 7, the semiconductor chip 202, which is an electronic component, is mounted on a surface on the other side of a mounting surface of the connector 302 on the print substrate 201 as in the third embodiment. The thermal grease 203 is inserted between the semiconductor chip 202 and a first convex portion 106A of the housing lower portion 104. In an area where the connector pin 301 is connected to the print substrate 201, the dielectric 204 is provided between the print substrate 201 and the housing lower portion 104. The connector pin 301 includes a connector pin connected to a GND terminal of the print substrate 201. The dielectric 204 is, for example, an insulating material in which a ceramic material is mixed with a silicone-based resin.

The housing upper portion 101 and the lower housing portion 104 are formed of metal and are fixed to each other by screws. The heat dissipation fins 102 are formed on outer surfaces of each of the housing upper portion 101 and the housing lower portion 104.

The dielectric 204 achieves capacitive coupling between the housing lower portion 104 and the print substrate 201. Accordingly, a noise current caused by the semiconductor chip 202 forms the noise current path 503 passing through the dielectric 204 and the print substrate 201 from the housing lower portion 104. Here, since the noise current path 503 is formed through an inner wall side of the housing lower portion 104, electromagnetic radiation generated by a noise current loop being exposed to the outside of a housing can be prevented. The noise current path 503 does not pass through the outside of the housing since the noise current path 503 has a lower impedance than the noise current path 503 passing through the outside of the housing shown in the comparative example in FIG. 1.

Heat generated in the semiconductor chip 202 is transferred from the thermal grease 203 to the housing lower portion 104 and the housing upper portion 101, and is conducted or radiated into the air from the heat dissipation fins 102 provided in the housing lower portion 104 and the housing upper portion 101.

Accordingly, even in a case where the electronic component is mounted on the surface on the other side of the mounting surface of the connector 302 on the print substrate 201, the electronic control device can prevent noise from leaking to the outside of the electronic control device while ensuring heat dissipation performance.

Sixth Embodiment

The sixth embodiment of the invention will be described with reference to FIG. 8. FIG. 8 is a cross-sectional view of an electronic control device. The same reference numerals are given to the same parts as those in the first embodiment shown in FIG. 2.

In the present embodiment, as shown in FIG. 8, the semiconductor chip 202, which is an electronic component, is mounted on a surface on the same side of a mounting surface of the connector 302 on the print substrate 201 as in the first embodiment. The thermal grease 203 is inserted between the semiconductor chip 202 and the first convex portion 106 of the housing upper portion 101. As in the first embodiment, the second convex portion 103 is provided on the housing upper portion 101 facing the print substrate 201 at a position on an inner side of the housing upper portion 101 and in the vicinity of the connector pin 301. The second convex portion 103 is formed in a U-shape seen from above in a manner of surrounding the connector 301. The dielectric 204 is formed between the second convex portion 103 and the print substrate 201. The dielectric 204 is, for example, an insulating material in which a ceramic material is mixed with a silicone-based resin. In the embodiment, the dielectric 204 is thinly coated to the same surface as the mounting surface of the connector 302 on the print substrate 201. For example, the dielectric 204 may be a solder resist of the print substrate 201. The second convex portion 103 is in contact with the dielectric 204. The dielectric 204 may be coated only between the print substrate 201 and the second convex portion 103.

The print substrate 201 includes a GND pattern and thus the dielectric 204 achieves capacitive coupling between the housing upper portion 101 and the print substrate 201. Accordingly, a noise current caused by the semiconductor chip 202 forms the noise current path 503 passing through the second convex portion 103, the dielectric 204, and the print substrate 201 from the housing upper portion 101. Here, since the noise current path 503 is formed through an inner wall side of the housing upper portion 101, electromagnetic radiation generated by a noise current loop being exposed to the outside of a housing can be prevented. The noise current path 503 does not pass through the outside of the housing since the noise current path 503 has a lower impedance than the noise current path 503 passing through the outside of the housing shown in the comparative example in FIG. 1.

Heat generated in the semiconductor chip 202 is transferred from the thermal grease 203 to the housing upper portion 101, and is conducted or radiated into the air from the heat dissipation fins 102 provided in the housing upper portion 101.

Accordingly, the capacitive coupling can be increased by thinning the dielectric 204 and thus the noise can be prevented from leaking to the outside of the electronic control device while ensuring heat dissipation performance.

Modification of Sixth Embodiment

The modification of the sixth embodiment will be described with reference to FIG. 9. FIG. 9 is a cross-sectional view of an electronic control device. The same reference numerals are given to the same parts as those in the sixth embodiment shown in FIG. 8.

In the sixth embodiment, the dielectric 204 is thinly coated to the same surface as the mounting surface of the connector 302 on the print substrate 201. However, in this case, processing accuracy is necessary for the second convex portion 103 of the housing upper portion 101 to contact the dielectric 204. In such a case, as shown in FIG. 9, a gap is provided between the second convex portion 103 and the dielectric 204 and a conductive elastic body 214 is inserted into the gap. The conductive elastic body 214 is, for example, a conductive fabric gasket. The elastic body 214 is pressed by a distal end of the second convex portion 103 to elastically deform so that the dielectric 204 coated on the print substrate 201 and the second convex portion 103 reliably contact with each other via the elastic body 214. According to such a configuration, high processing accuracy is not required for the processing of the second convex portion 103.

Seventh Embodiment

The seventh embodiment of the invention will be described with reference to FIG. 10. FIG. 10 is a cross-sectional view of an electronic control device. The same reference numerals are given to the same parts as those in the first embodiment shown in FIG. 2.

In the present embodiment, as shown in FIG. 10, the semiconductor chip 202, which is an electronic component, is mounted on a surface on the same side of amounting surface of the connector 302 on the print substrate 201 as in the first embodiment. The thermal grease 203 is inserted between the semiconductor chip 202 and the first convex portion 106 of the housing upper portion 101. A connector shield 208 (third convex portion) having an L-shaped cross section is provided on the print substrate 201 and covers a part of the connector pin 301 and the connector 302. The connector shield 208 is a conductive metal and is connected to a GND pattern on the print substrate 201. Alternatively, the connector shield 208 is connected with the GND pattern on the print substrate 201 via a capacitor. The dielectric 204 is inserted between the connector shield 208 and the housing upper portion 101. In other words, the dielectric 204 is provided between the third convex portion 208 formed on the print substrate 201 and convex toward a housing upper portion 101 side, and the housing upper portion 101. The dielectric 204 is, for example, an insulating material in which a ceramic material is mixed with a silicone-based resin.

The dielectric 204 achieves capacitive coupling between the housing upper portion 101 and the connector shield 208. Accordingly, a noise current caused by the semiconductor chip 202 forms the noise current path 503 passing through the dielectric 204, the connector shield 208, and the print substrate 201 from the housing upper portion 101. Here, since the noise current path 503 is formed through an inner wall side of the housing upper portion 101, electromagnetic radiation generated by a noise current loop being exposed to the outside of a housing can be prevented. The noise current path 503 does not pass through the outside of the housing since the noise current path 503 has a lower impedance than the noise current path 503 passing through the outside of the housing shown in the comparative example in FIG. 1.

Heat generated in the semiconductor chip 202 is transferred from the thermal grease 203 to the housing upper portion 101, and is conducted or radiated into the air from the heat dissipation fins 102 provided in the housing upper portion 101.

Accordingly, the electronic control device can prevent noise from leaking to the outside of the electronic control device while ensuring heat dissipation performance even in a case where it is difficult to form a shape of a convex portion or the like in the housing.

Eighth Embodiment

The eighth embodiment of the invention will be described with reference to FIG. 11. FIG. 11 is a cross-sectional view of an electronic control device. The same reference numerals are given to the same parts as those in the seventh embodiment shown in FIG. 10.

In the present embodiment, as shown in FIG. 11, the semiconductor chip 202, which is an electronic component, is mounted on a surface on the same side of amounting surface of the connector 302 on the print substrate 201 as in the first embodiment. The thermal grease 203 is inserted between the semiconductor chip 202 and the first convex portion 106 of the housing upper portion 101. The second convex portion 103 is formed in a U-shape seen from above in a manner of surrounding the connector 302 and faces the print substrate 201 at a position on an inner side of the housing upper portion 101 and in the vicinity of the connector pin 301. The dielectric 204 is filled to cover the connector pin 301 surrounded by the second convex portion 103. The connector pin 301 includes a connector pin connected to a GND terminal of the print substrate 201. The dielectric 204 is, for example, an insulating material in which a ceramic material is mixed with a silicone-based resin.

The dielectric 204 achieves capacitive coupling between the housing upper portion 101 and the connector pin 301. Accordingly, a noise current caused by the semiconductor chip 202 forms the noise current path 503 passing through the dielectric 204, the connector pin 301, and the print substrate 201 from the housing upper portion 101. Here, since the noise current path 503 is formed through an inner wall side of the housing upper portion 101, electromagnetic radiation generated by a noise current loop being exposed to the outside of a housing can be prevented. The noise current path 503 does not pass through the outside of the housing since the noise current path 503 has a lower impedance than the noise current path 503 passing through the outside of the housing shown in the comparative example in FIG. 1.

Heat generated in the semiconductor chip 202 is transferred from the thermal grease 203 to the housing upper portion 101, and is conducted or radiated into the air from the heat dissipation fins 102 provided in the housing upper portion 101.

Accordingly, the electronic control device can prevent noise from leaking to the outside of the electronic control device while ensuring heat dissipation performance. In particular, since the noise current is directly coupled to the connector pin 301 which may be an outlet of the noise current, the noise current can be prevented from flowing to the wire harness 401.

Ninth Embodiment

The ninth embodiment of the invention will be described with reference to FIG. 12. FIG. 12 is a cross-sectional view of an electronic control device. The same reference numerals are given to the same parts as those in the eighth embodiment shown in FIG. 11.

As shown in FIG. 12, the semiconductor chip 202, which is an electronic component, is mounted on a surface on the same side of a mounting surface of the connector 302 on the print substrate 201 as in the first embodiment. The thermal grease 203 is inserted between the semiconductor chip 202 and the first convex portion 106 of the housing upper portion 101. The second convex portion 103 is formed in a U-shape seen from above in a manner of surrounding the connector 302 and faces the print substrate 201 at a position on an inner side of the housing upper portion 101 and in the vicinity of the connector pin 301. In the present embodiment, a shield connector having a shield conductor 303 is used as the connector 302. The shield connector is connected to a GND terminal on a print substrate 201 side, and is also connected to a shield cable 402 coated around a cable on a cable side. The dielectric 204 is filled between the shield conductor 303 of the connector 302 and the housing upper portion 101 surrounded by the second convex portion 103. The dielectric 204 is, for example, an insulating material in which a ceramic material is mixed with a silicone-based resin.

The dielectric 204 achieves capacitive coupling between the housing upper portion 101 and the shield conductor 303 of the connector 302. Accordingly, a noise current caused by the semiconductor chip 202 forms the noise current path 503 passing through the dielectric 204, the shield conductor 303, and the print substrate 201 from the housing upper portion 101. Here, since the noise current path 503 is formed through the inner wall side of the housing upper portion 101, electromagnetic radiation generated by a noise current loop being exposed to the outside of a housing can be prevented. The noise current path 503 does not pass through the outside of the housing since the noise current path 503 has a lower impedance than the noise current path 503 passing through the outside of the housing shown in the comparative example in FIG. 1.

Heat generated in the semiconductor chip 202 is transferred from the thermal grease 203 to the housing upper portion 101, and is conducted or radiated into air from the heat dissipation fins 102 provided in the housing upper portion 101.

Accordingly, the electronic control device can prevent noise from leaking to the outside of the electronic control device while ensuring heat dissipation performance. In particular, since the noise current is directly coupled to the shield conductor 303 of the connector 302 which may be an outlet of the noise current, the noise current can be prevented from flowing to the wire harness 401.

Tenth Embodiment

The tenth embodiment of the invention will be described with reference to FIGS. 13 and 14. FIG. 13 is a cross-sectional view of an electronic control device. FIG. 14 is a top view of the electronic control device with the housing upper portion 101 removed. The same reference numerals are given to the same parts as those in the first embodiment shown in FIGS. 2 and 3.

As shown in FIG. 13, the semiconductor chip 202, which is an electronic component, is mounted on a surface on the same side of a mounting surface of the connector 302 on the print substrate 201 as in the first embodiment. The thermal grease 203 is inserted between the semiconductor chip 202 and the first convex portion 106 of the housing upper portion 101. The second convex portion 103 contacting the print substrate 201 is formed at a position on an inner side of the housing upper portion 101 and in the vicinity of the connector pin 301. The second convex portion 103 is fixed to the print substrate 201 by a screw 209 inserted from a back side of the print substrate 201. A distal end of the second convex portion 103 contacts a conductive pattern 211 (see FIG. 14) provided on a surface of the print substrate 201.

FIG. 14 is a top view of the electronic control device in a state where the housing upper portion 101 is removed as in the present embodiment. FIG. 13 is a cross-sectional view at a position of B-B' in FIG. 14. As shown in FIG. 14, the print substrate 201 has the screw holes 205 at four corners thereof and is fixed to the housing upper portion 101 (not shown) by screws. The housing lower portion 104 has the screw holes 105 at four corners thereof and is fixed to the housing upper portion 101 by screws.

As shown in FIG. 14, the conductive pattern 211 is provided on the print substrate 201 contacting the second convex portion 103. A GND pattern 213 connected to a GND terminal of the print substrate 201 is provided at a position close to the conductive pattern 211. Three chip capacitors 210 are disposed between the conductive pattern 211 and the GND pattern 213 in a manner of straddling both of them. One end of each chip capacitor 210 is connected with the conductive pattern 211 and the other end is connected with the GND pattern 213. Although three chip capacitors 210 have been described in the example, the chip capacitor 210 can be appropriately increased or decreased according to capacitance. The thermal grease 203 on the semiconductor chip 202 is coated to the area 206 on the print substrate 201 in a manner of including the semiconductor chip 202.

The chip capacitors 210 achieve capacitive coupling between the print substrate 201 and the second convex portion 103. Accordingly, a noise current caused by the semiconductor chip 202 forms the noise current path 503 (see FIG. 13) passing through the second convex portion 103, the chip capacitors 210, and the print substrate 201 from the housing upper portion 101. Here, since the noise current path 503 is formed through an inner wall side of the housing upper portion 101, electromagnetic radiation generated by a noise current loop being exposed to the outside of a housing can be prevented. The noise current path 503 does not pass through the outside of the housing since the noise current path 503 has a lower impedance than the noise current path 503 passing through the outside of the housing shown in the comparative example in FIG. 1.

Heat generated in the semiconductor chip 202 is transferred from the thermal grease 203 to the housing upper portion 101, and is conducted or radiated into the air from the heat dissipation fins 102 provided in the housing upper portion 101.

Accordingly, the electronic control device can prevent noise from leaking to the outside of the electronic control device while ensuring heat dissipation performance. In particular, the present embodiment can be applied to a case where it is difficult to use a dielectric for capacitive coupling.

Eleventh Embodiment

The eleventh embodiment of the invention will be described with reference to FIGS. 15 and 16. FIG. 15 is a cross-sectional view of an electronic control device. FIG. 16 is a top view of the electronic control device with the housing upper portion 101 removed. The same reference numerals are given to the same parts as those in the first embodiment shown in FIGS. 2 and 3.

As shown in FIG. 15, semiconductor chips 202, which are electronic components, are mounted on the print substrate 201. In the present embodiment, a plurality of semiconductor chips 202 are mounted on the print substrate 201. The connector 302 that connects the wire harness 401 for drawing in a power source and a communication wire is mounted on the print substrate 201. The connector pin 301 is connected to the print substrate 201.

The entire print substrate 201 is sandwiched between the housing upper portion 101 and the housing lower portion 104. The thermal grease 203 is inserted between each semiconductor chip 202 and each first convex portion 106 of the housing upper portion 101. Heat generated in each semiconductor chip 202 is transferred from the thermal grease 203 to the housing upper portion 101, and is conducted or radiated into the air from the heat dissipation fins 102 provided in the housing upper portion 101.

As shown in the cross-sectional view of the electronic control device in FIG. 15, the second convex portion 103 is provided on the housing upper portion 101 facing the print substrate 201 at a position on an inner side of the housing upper portion 101 and in the vicinity of the connector pin 301. The shape of the second convex portion 103 is similar as that of the first embodiment described with reference to FIG. 2. That is, the second convex portion 103 is formed in a U-shape seen from above in a manner of surrounding the connector 302 facing the print substrate 201 at the position on the inner side of the housing upper portion 101 and in the vicinity of the connector pin 301. The dielectric 204 is inserted between the second convex portion 103 and the print substrate 201. The dielectric 204 is, for example, an insulating material in which a ceramic material is mixed with a silicone-based resin.

FIG. 16 is a top view of the electronic control device in a state where the housing upper portion 101 is removed. FIG. 15 is a cross-sectional view at a position of C-C' in FIG. 16. As shown in FIG. 16, the print substrate 201 has the screw holes 205 at four corners thereof and is fixed to the housing upper portion 101 (not shown) by screws. The housing lower portion 104 has the screw holes 105 at four corners thereof and is fixed to the housing upper portion 101 by screws.

In the present embodiment, the plurality of semiconductor chips 202 are disposed on the print substrate 201. The thermal grease 203 is coated to each area 206 on the print substrate 201 in a manner of including each semiconductor chip 202. The dielectric 204 is coated to the area 207 on the print substrate 201 facing the second convex portion 103 provided on the inner side of the housing upper portion 101.

The print substrate 201 includes a GND pattern and thus the dielectric 204 achieves capacitive coupling between the housing upper portion 101 and the print substrate 201. Accordingly, a noise current caused by one of the semiconductor chips 202 forms the noise current path 503 passing through the second convex portion 103, the dielectric 204, and the print substrate 201 from the housing upper portion 101. Noise currents caused by other semiconductor chips 202 also form the same noise current paths 503, respectively. Here, since each noise current path 503 is formed through an inner wall side of the housing upper portion 101, electromagnetic radiation generated by a noise current loop being exposed to the outside of a housing can be prevented. Each noise current path 503 does not pass through the outside of the housing since the noise current path 503 has a lower impedance than the noise current path 503 passing through the outside of the housing shown in the comparative example in FIG. 1.

Accordingly, the electronic control device can prevent noise from leaking to the outside of the electronic control device while ensuring heat dissipation performance even in a case where a plurality of electronic components are mounted. Although a case where one electronic component exists is described as an example in the second to the tenth embodiments, in each embodiment, a plurality of electronic components may be mounted in the same manner as in the present embodiment.

According to the embodiments described above, the following operational effects are obtained.

(1) The electronic control device is an electronic control device including a housing (the housing is constituted by the housing upper portion 101 and the housing lower portion 104 in the embodiments) that stores the print substrate 201 on which the semiconductor chip 202 is mounted, a thermal grease 203 formed between the housing (101, 104) and the semiconductor chip 202, and a dielectric 204 formed between the housing (101, 104) and the print substrate 201. The noise transmission path 503 is formed between the housing (101, 104) and the print substrate 201 via the thermal grease 203 and the dielectric 204. Accordingly, noise caused by operation of an electronic component such as the semiconductor chip 202 can be prevented from leaking to the outside of the electronic control device.

(2) The electronic control device includes the thermal grease 203 inserted between the housing (101, 104) and the semiconductor chip 202 and the dielectric 204 inserted between the housing (101, 104) and the print substrate 201. Accordingly, noise caused by operation of the electronic component such as the semiconductor chip 202 can be prevented from leaking to the outside of the electronic control device.

(3) The housing (101, 104) of the electronic control device includes a plurality of members (housing upper portion 101 and housing lower portion 104), and at least one of the plurality of members has a heat dissipation portion (heat dissipation fin 102). The thermal grease 203 is provided between the semiconductor chip 202 and a first convex portion (106, 106A) that is formed on one of the housing upper portion 101 and the housing lower portion 104 including the heat dissipation portion (heat dissipation fin 102) and is convex toward a print substrate 201 side. Accordingly, noise caused by operation of the electronic component such as the semiconductor chip 202 can be prevented from leaking to the outside of the electronic control device while ensuring heat dissipation performance.

(4) In the electronic control device, the dielectric 204 is provided between the print substrate 201 and a second convex portion (103, 103A) that is formed on the housing (101, 104) and is convex toward the print substrate 201 side. Accordingly, noise caused by operation of the electronic component such as the semiconductor chip 202 can be prevented from leaking to the outside of the electronic control device.

(5) The electronic control device is provided with the second convex portion 103 in a manner of surrounding a terminal (connector 302) that establishes an electrical connection from the print substrate 201 to an external device. Accordingly, electromagnetic waves radiated directly from the electronic component on the print substrate 201 to a space in the housing the can be prevented from leaking.

(6) In the electronic control device, a distal end of the second convex portion 103 is divided into a plurality of portions. The electronic component is disposed between the plurality of portions of the divided second convex portion 103. Accordingly, the tall component 215 that does not interfere with the second convex portion 103 is disposed in a space between a plurality of distal ends of the second convex portion 103, and noise caused by operation of the electronic component can be prevented from leaking to the outside of the electronic control device.

(7) The housing of the electronic control device includes a plurality of members (housing upper portion 101 and housing lower portion 104). The second convex portion 103 is provided on a member among the plurality of members that faces a surface of the print substrate 201 on the other side of amounting surface of a terminal (connector 302) that establishes an electrical connection from the print substrate 201 to the external device. Accordingly, noise caused by operation of the electronic component can be prevented from leaking to the outside of the electronic control device even if an electronic component is mounted on the surface on the other side of the terminal mounting surface of the print substrate 201.

(8) The electronic control device is formed by coating the solder resist 204 onto the print substrate 201. Accordingly, capacitive coupling can be increased by thinning a dielectric such as the solder resist 204, and noise can be prevented from leaking to the outside of the electronic control device.

(9) In the electronic control device, a conductive elastic body is inserted between the solder resist 204 and the housing (101, 104). Accordingly, the noise can be prevented from leaking to the outside of the electronic control device without requiring high processing accuracy for the processing of the second convex portion 103.

(10) In the electronic control device, the dielectric 204 is provided between the housing (101, 104) and a third convex portion that is formed on the print substrate 201 and is convex toward the housing (101, 104) side. Accordingly, noise leaking to the outside of the electronic control device can be prevented even in a case where it is difficult to form the shape of the convex portion or the like in the housing.

(11) In the electronic control device, the dielectric 204 is provided between the housing (101, 104) and the connector pin 301 that establishes an electrical connection from the print substrate 201 to an external device. Since the noise current is directly coupled to the connector pin 301 which may be an outlet of the noise current, the noise current can be prevented from flowing to the wire harness 401.

(12) In the electronic control device, the dielectric 204 is provided between the housing (101, 104) and the shield conductor 303 that establishes an electrical connection from the print substrate 201 to an external device. Since the noise current is directly coupled to the shield conductor 303 of the connector 302 which may be an outlet of the noise current, the noise current can be prevented from flowing to the wire harness 401.

(13) In the electronic control device, a dielectric is formed by the chip capacitor 210 mounted on the print substrate 201. Accordingly, the embodiments can be applied to a case where it is difficult to use the dielectric for capacitive coupling.

(14) The housing (101, 104) of the electronic control device stores the print substrate 201 on which a plurality of semiconductor chips 202 are mounted. The first capacitance unit 203, which is a thermal grease, is provided in a space between the housing (101, 104) and each of the plurality of semiconductor chips 202. Accordingly, the noise can be prevented from leaking to the outside of the electronic control device even in a case where a plurality of electronic components are mounted.

The invention is not limited to the above-described embodiments, and other embodiments conceivable within the scope of the technical idea of the invention are also included in the scope of the invention as long as the features of the invention are not impaired. The above-described embodiments may be combined.

A disclosed content of the following priority basic application is incorporated herein by reference.

Japanese Patent Application No. 2017-236298 (filed on Dec. 8, 2017)

REFERENCE SIGN LIST

101: housing upper portion
102: heat dissipation fin
103: second convex portion
104: housing lower portion
105: screw hole
106: first convex portion
201: print substrate
202: semiconductor chip
203: thermal grease
204: dielectric
205: screw hole
206: thermal grease coated area
207: dielectric material coated area
208: connector shield
209: screw
210: chip capacitor
211: conductive pattern
213: GND pattern
214: conductive elastic body
215: electrolytic capacitor
301: connector pin
302: connector
303: shield conductor of connector
401: wire harness
402: shield cable
501: ground (vehicle body)
502: parasitic capacitance between housing and ground
503: noise current path via thermal grease

The invention claimed is:

1. An electronic control device comprising: a housing that stores a substrate on which an electronic component is mounted; a first capacitance unit formed between the housing and the electronic component; and a second capacitance unit formed between the housing and the substrate, wherein a noise transmission path is formed between the housing and the substrate via the first capacitance unit and the second capacitance unit, wherein the first capacitance unit includes a first dielectric inserted between the housing and the electronic component, and the second capacitance unit includes a second dielectric inserted between the housing and the substrate, wherein the housing includes a plurality of members, at least one of the plurality of members having a heat dissipation portion, and the first dielectric is provided between the electronic component and a first convex portion that is formed on the member of the housing having the heat dissipation portion and is convex toward a print substrate side.

2. The electronic control device according to claim 1, wherein the second dielectric is provided between the substrate and a second convex portion that is formed on the housing and is convex toward the print substrate side.

3. The electronic control device according to claim 2, wherein the second convex portion is provided in a manner of surrounding a terminal that establishes an electrical connection from the substrate to an external device.

4. The electronic control device according to claim 2, wherein a distal end of the second convex portion is divided into a plurality of portions, and the electronic component is disposed between the plurality of portions of the divided second convex portion.

5. The electronic control device according to claim 2, wherein the housing includes a plurality of members, and the second convex portion is provided on a member among the plurality of members, facing a surface of the substrate on the other side of a mounting surface of a terminal that establishes an electrical connection from the substrate to an external device.

6. The electronic control device according to claim 1, wherein the second dielectric is formed by being coated onto the substrate.

7. The electronic control device according to claim 6, wherein a conductive elastic body is inserted between the second dielectric and the housing.

8. The electronic control device according to claim 1, the second dielectric is provided between the housing and a third convex portion that is formed on the substrate and is convex toward a housing side.

9. The electronic control device according to claim 1, the second dielectric is provided between the housing and a terminal that establishes an electrical connection from the substrate to an external device.

10. The electronic control device according to claim 1, wherein the second dielectric is provided between the housing and an external conductor that establishes an electrical connection from the substrate to an external device.

11. The electronic control device according to claim 1, wherein the second capacitance unit is formed by a capacitor mounted on the substrate.

12. The electronic control device according to claim 1, wherein the housing stores the substrate on which a plurality of electronic components are mounted, and the first capacitance unit has a plurality of capacitance units formed between the housing and each of the plurality of electronic components.

* * * * *